United States Patent
Barbos et al.

(10) Patent No.: US 12,222,531 B2
(45) Date of Patent: Feb. 11, 2025

(54) EXTERNAL PART FOR A TIMEPIECE OR A PIECE OF JEWELLERY COMPRISING AN INTERFERENTIAL COLOUR COATING AND MANUFACTURING METHOD OF SAID PART

(71) Applicant: Omega SA, Bienne (CH)

(72) Inventors: Corina Barbos, La Chaux-de-Fonds (CH); Frédéric Jeanrenaud, La Chaux-de-Fonds (CH); Gregory Kissling, La Neuveville (CH)

(73) Assignee: Omega SA, Bienne (CH)

( * ) Notice: Subject to any disclaimer, the term of this patent is extended or adjusted under 35 U.S.C. 154(b) by 511 days.

(21) Appl. No.: 17/573,714

(22) Filed: Jan. 12, 2022

(65) Prior Publication Data

US 2022/0299689 A1   Sep. 22, 2022

(30) Foreign Application Priority Data

Mar. 18, 2021  (EP) .................................. 21163489

(51) Int. Cl.
*G02B 5/28*   (2006.01)
*A44C 27/00*  (2006.01)
(Continued)

(52) U.S. Cl.
CPC ............ *G02B 5/285* (2013.01); *A44C 27/006* (2013.01); *A44C 27/007* (2013.01); *C23C 14/08* (2013.01);
(Continued)

(58) Field of Classification Search
CPC ........ G02B 5/285; G02B 1/14; A44C 27/006; A44C 27/007; C23C 14/08; C23C 14/10;
(Continued)

(56) References Cited

U.S. PATENT DOCUMENTS 4,978,394 A * 12/1990 Ostertag ............... A61K 8/0241
106/404
5,700,550 A    12/1997 Uyama et al.
(Continued)

FOREIGN PATENT DOCUMENTS

CN    1737679 A    2/2006
EP    2392689 A1   12/2011
(Continued)

OTHER PUBLICATIONS

European Search Report issued Aug. 27, 2021 in European Application 21163489.4, filed on Mar. 18, 2021, 3 pages (with English Translation of Categories of cited documents).
(Continued)

*Primary Examiner* — William R Alexander
(74) *Attorney, Agent, or Firm* — Oblon, McClelland, Maier & Neustadt, L.L.P.

(57) ABSTRACT

An external part including a substrate and a coating composed of the following successively superimposed layers; an opaque or semi-opaque reflective layer, configured to have a reflectance of at least 90% for wavelengths including between 600 nm and 780 nm, a transparent or semi-transparent layer, having a refractive index to include between 1.45 and 2.8 for a wavelength of 630 nm, an absorbent layer, the layers giving the coating a predetermined interference colour.

20 Claims, 1 Drawing Sheet

(51) Int. Cl.
*C23C 14/08* (2006.01)
*C23C 14/10* (2006.01)
*C23C 14/14* (2006.01)
*C23C 28/00* (2006.01)
*G04B 19/12* (2006.01)
*G04B 37/22* (2006.01)
*G04B 45/00* (2006.01)

(52) U.S. Cl.
CPC .............. *C23C 14/10* (2013.01); *C23C 14/14* (2013.01); *C23C 28/32* (2013.01); *C23C 28/3455* (2013.01); *G04B 19/12* (2013.01); *G04B 37/22* (2013.01); *G04B 45/0015* (2013.01)

(58) Field of Classification Search
CPC ........ C23C 14/14; G04B 19/12; G04B 37/22; G04B 45/0015
USPC ......................................................... 359/584

See application file for complete search history.

(56) References Cited

U.S. PATENT DOCUMENTS

| | | | |
|---|---|---|---|
| 6,569,529 | B1 | 5/2003 | Phillips et al. |
| 6,849,343 | B2 | 2/2005 | Phillips et al. |
| 11,016,680 | B2* | 5/2021 | Hart ........................ C03C 3/091 |
| 2003/0203222 | A1 | 10/2003 | Phillips et al. |
| 2003/0203223 | A1 | 10/2003 | Phillips et al. |
| 2003/0215641 | A1 | 11/2003 | Phillips et al. |
| 2005/0287369 | A1 | 12/2005 | Phillips et al. |
| 2010/0209698 | A1 | 8/2010 | Kornherr et al. |
| 2017/0348202 | A1* | 12/2017 | Grüner ..................... A61Q 3/02 |
| 2018/0181071 | A1 | 6/2018 | Spassov |
| 2019/0179550 | A1* | 6/2019 | Hart ........................ G02B 1/14 |

FOREIGN PATENT DOCUMENTS

| | | |
|---|---|---|
| EP | 3 339 983 A1 | 6/2018 |
| JP | H 08329530 A | 12/1996 |

OTHER PUBLICATIONS

Chinese Office Action dated Jul. 24, 2024, issued in Chinese Patent Application No. 202210269004.4.

* cited by examiner

EXTERNAL PART FOR A TIMEPIECE OR A PIECE OF JEWELLERY COMPRISING AN INTERFERENTIAL COLOUR COATING AND MANUFACTURING METHOD OF SAID PART

CROSS-REFERENCE TO RELATED APPLICATION

This application claims priority to European Patent Application No. 21163489.4 filed on Mar. 18, 2021, the entire disclosure of which is hereby incorporated herein by reference.

TECHNICAL FIELD OF THE INVENTION

The invention relates to the field of watchmaking or jewellery, and relates more particularly to an external part for a timepiece or a piece of jewellery comprising a coating giving an interference colour, and a method for manufacturing said part.

In the present text, the term "external parts" denotes any decorative article in the fields of watchmaking or jewellery, for example consisting of a case, a dial, a dial applique, a bracelet, etc. intended to be visible to a user.

Preferably, the present invention relates to an external part for a timepiece or a piece of jewellery comprising a coating, the interference colour of which is a shade of red.

TECHNOLOGICAL BACKGROUND

In the field of watchmaking or jewellery, and more generally in that of decorative articles, the deposition methods by painting, varnishing or enamelling are not always adapted.

Indeed, on the one hand, the layer of material applied to the surface of an article to be decorated is too thick to reveal any surface structures, for example a brushed, sunray, sandblasted, laser-structured surface, etc., and on the other hand, the life of this layer and consequently of its colour is not always satisfactory.

Thus, thin-film vacuum deposition techniques, such as physical vapour deposition methods (known by the acronym "PVD"), chemical vapour deposition methods (known by the acronym "CVD"), atomic layer deposition methods (known by the acronym "ALD"), are preferred.

However, despite the fact that these deposition techniques allow to obtain coatings of a multitude of colours, the implementation of these methods does not allow to obtain certain specific colours on an industrial scale, such as shades of red.

SUMMARY OF THE INVENTION

The invention overcomes the aforementioned drawbacks by providing a solution for producing an external part having a predetermined interference colour resulting from the addition of destructive interference and constructive interference. In the present text, a colour generated by an optical interference phenomenon is called "interference colour".

To this end, the present invention relates to an external part comprising a substrate including a coating composed of the following successively superimposed layers:
- an opaque or semi-opaque reflective layer, configured to have a reflectance of at least 90% for wavelengths comprised between 600 nm and 780 nm,
- a transparent or semi-transparent layer, having a refractive index comprised between 1.45 and 2.8 for a wavelength of 630 nm,
- an absorbent layer.

Said layers give the coating a predetermined interference colour.

Advantageously, the predetermined colour is a shade of red having a metallic lustre. More specifically, the predetermined colour is a shade of burgundy red or purple red. This predetermined colour is obtained by the particular arrangement of the optical stack defined by the layers of the coating.

Furthermore, the coating has a very low thickness, typically less than 3 µm, which allows to be adapted for covering any decorative article comprising a surface structure or comprising a complex geometric shape.

Another advantage of the present invention lies in the fact that it allows to obtain a very wide variety of shades of red without substantial modification of the thickness of the coating. For example, the thickness of the coating varies at most by a value of less than 3 nm between all shades of red that said coating may have.

In particular embodiments, the invention may further include one or more of the following features, taken alone or in any technically possible combination.

In particular embodiments, the reflective layer is made of a metallic material selected from copper (Cu), gold (Au), rhodium (Rh), platinum (Pt).

In particular embodiments, the reflective layer is made of Cu.

In particular embodiments, the reflective layer has a thickness of at least 40 nm.

In particular embodiments, the reflective layer has a thickness of 100 nm.

In particular embodiments, the transparent layer is made of a material selected from silicon dioxide ($SiO_2$), titanium dioxide ($TiO_2$), alumina ($Al_2O_3$), hafnium dioxide ($HfO_2$), zirconium dioxide ($ZrO_2$), tantalum oxide ($Ta_2O_5$), tin dioxide ($SnO_2$), indium tin oxide (ITO), zinc oxide (ZnO), magnesium oxide (MgO), silicon nitride ($Si_3N_4$) and aluminium nitride (AlN).

In particular embodiments, the transparent layer is made of $SiO_2$.

In particular embodiments, the transparent layer has a thickness comprised between 10 nm and 50 nm.

In particular embodiments, the transparent layer has a thickness of 30 nm.

In particular embodiments, the absorbent layer is made of a material selected from: titanium (Ti), nickel (Ni) or chromium (Cr).

In particular embodiments, the absorbent layer is made of Cr.

In particular embodiments, the absorbent layer comprises a thickness comprised between 5 nm and 8 nm.

In particular embodiments, the coating has a reflection rate less than 10% for wavelengths comprised between 350 nm and 600 nm, and greater than or equal to 10% for wavelengths comprised between 620 nm and 780 nm.

In particular embodiments, the coating has a red colour characterised in the CIELAB chromatic space, illuminating D65, by a parameter L* comprised between 25 and 35, a parameter a* comprised between 8 and 15, and a parameter b* comprised between 0 and 7.

In particular embodiments, the coating comprises an acrylic and/or nitrocellulose protective layer superimposed on the absorbent layer and having a refractive index between 1.48 and 1.51 for a wavelength of 630 nm.

According to another object, the present invention relates to a method for manufacturing an external part for a timepiece or a piece of jewellery characterised in that it comprises the following successive steps of generating a coating on a surface of a substrate:

depositing an opaque reflective layer on a substrate, said layer being configured to have a reflectance of at least 90% for wavelengths comprised between 600 nm and 780 nm, depositing a transparent layer with a refractive index comprised between 1.45 and 2.8 at 630 nm, depositing an absorbent layer.

In particular embodiments, the deposition of the reflective, transparent and absorbent layers is carried out by a method of physical vapour deposition with electron gun evaporation.

In particular embodiments, the step of depositing the transparent layer is carried out with a deposition rate comprised between 0.01 nm/s and 0.1 nm/s.

In particular embodiments, the step of depositing the absorbent layer is carried out with a deposition rate comprised between 0.01 nm/s and 0.05 nm/s.

In particular embodiments, the method comprises a final step of depositing a protective layer configured to advantageously include a refractive index comprised between 1.48 and 1.51 for a wavelength of 630 nm.

BRIEF DESCRIPTION OF THE FIGURES

Other features and advantages of the invention will become apparent upon reading the following detailed description given by way of non-limiting example, with reference to the appended drawings wherein.

DETAILED DESCRIPTION OF THE INVENTION

Figure 1:
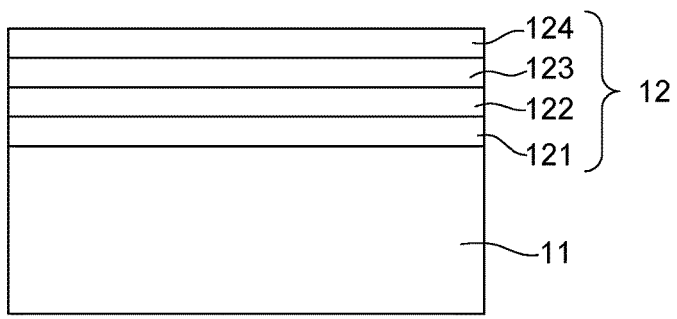
FIG. 1 schematically shows a sectional view of an external part according to a preferred exemplary embodiment of the invention.

The present invention relates to an external part 10 comprising a substrate 11 including a coating 12 composed of several successively superimposed layers allowing to give the external part, on a surface intended to be visible to a user, a predetermined interference colour.

Preferably, the predetermined interference colour is a shade of red.

The substrate 11 can be made of a metallic, ceramic or polymer material. Moreover, it can be coated with a galvanic under-layer.

On the substrate 11 is deposited a reflective, opaque or semi-opaque layer 121, configured to reflect wavelengths comprised between 600 nm and 780 nm.

More specifically, the reflective layer 121 preferably has a reflection coefficient greater than 0.9 for wavelengths comprised between 600 nm and 780 nm.

The reflective layer 121 may be semi-opaque in the sense that it may have a transmittance other than zero, however, the transmittance must remain less than or equal to 15% over the wavelength range of the visible spectrum.

This reflective layer 121 is preferably made of a metallic material and has a thickness of at least 40 nm.

Preferably, the reflective layer 121 is made of a material which is selected from: Cu, Au, Rh or Pt. The material of the reflective layer 121 is selected for its optical capacity to reflect the wavelengths comprised between 600 nm and 780 nm, this interval being representative of shades of red in the light spectrum. Furthermore, this material is selected for its low absorption of wavelengths in the red.

More preferably still, the reflective layer 121 is made of Cu, in particular for economic reasons and for ease of implementation.

The reflective layer 121 can be produced by the PVD method, by galvanisation or by any other suitable thin film deposition method.

A transparent layer 122 is superimposed on the reflective layer 121.

The transparent layer 122 can also be semi-transparent in the sense that it can absorb light over a certain range of wavelengths, for example wavelengths less than 500 nm in the case where said transparent layer 122 would be made of TiO2, and be transparent to light over another range of wavelengths.

The material of this transparent layer 122 is selected for its optical properties of transparency. By way of example, the transparent layer 122 is made of a material selected from: SiO2, TiO2, Al2O3, HfO2, ZrO2, Ta2O5, SnO2, ITO, ZnO, MgO, Si3N4, AlN. Preferably, the transparent layer 122 is made of SiO2, in particular for economic reasons, ease of implementation and repeatability.

For example, the transparent layer 122 advantageously has a refractive index comprised between 1.45 and 2.8 for a wavelength of 630 nm and has a thickness comprised between 10 nm and 50 nm, depending on the refractive index of said layer.

The transparent layer 122 can be deposited on the reflective layer 121 by PVD, CVD, ALD method, or by any other appropriate thin film deposition method.

Finally, as shown in FIG. 1, an absorbent layer is superimposed on the transparent layer 122.

This absorbent layer 123 is made of a metallic material, selected for its optical absorption properties. For example, the absorbent layer 123 is made of Ti, Ni or Cr. Preferably, the absorbent layer 123 is made of chrome.

The absorbent layer 123 has a thickness comprised between 4 nm and 10 nm, preferably between 5 nm and 8 nm, and even more preferably between 7.2 nm and 7.8 nm.

It is understood here that the present invention allows, thanks to the coating 12, to advantageously obtain an interference colour in shade of red, said coating 12 having a very low thickness, of the order of a few thousandths of a millimetre, more precisely less than 3 μm.

Figure 2:
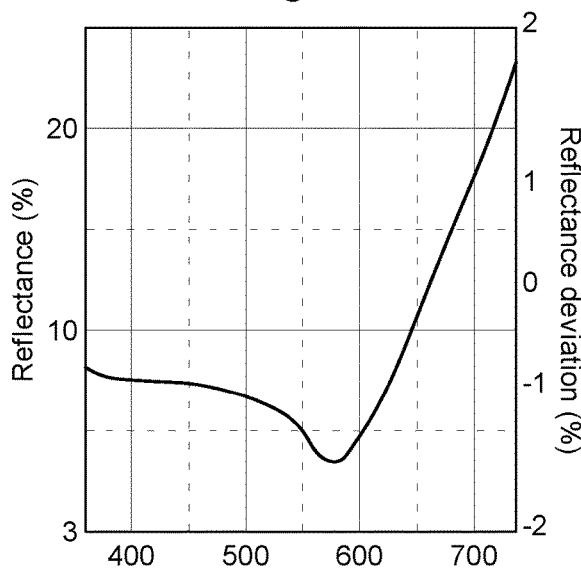
FIG. 2 shows a spectral reflectance curve measured with a spectrocolourimeter on a coating according to the invention.

The coating 12 is advantageously configured, thanks to the aforementioned features, so as to have a reflection rate of less than 10%, varying from 8% to 3%, for wavelengths comprised between 350 nm and 580 nm, and varying from 3% to 24% for wavelengths comprised between 580 nm and 750 nm. These values are represented graphically by the spectral reflectance curve of FIG. 2, resulting from measurements carried out with a spectrocolorimeter on the coating 12.

These reflection rates can advantageously define a reflection spectrum representative of a visual perception of a user of a colour comprised in a shade of red.

In a preferred exemplary embodiment of the invention, the coating 12 can further advantageously include an acrylic and/or nitrocellulose protective layer 124, superimposed on the absorbent layer 123, in order to protect the other layers from possible chemical and/or mechanical attacks.

The addition of such a protective layer 124, for example with a thickness of 3 μm with a refractive index close to 1.5, for example between 1.48 and 1.51 for wavelengths of 630 nm, also allows to generate destructive interference which advantageously reduces the reflection rate between 350 nm and 550 nm, allowing the wavelengths between 580 nm and 780 nm to define the colour of the coating 12.

In other words, in the preferred exemplary embodiment of the invention, the protective layer 124 advantageously participates in obtaining the final red colour of the coating 12.

Figure 3:
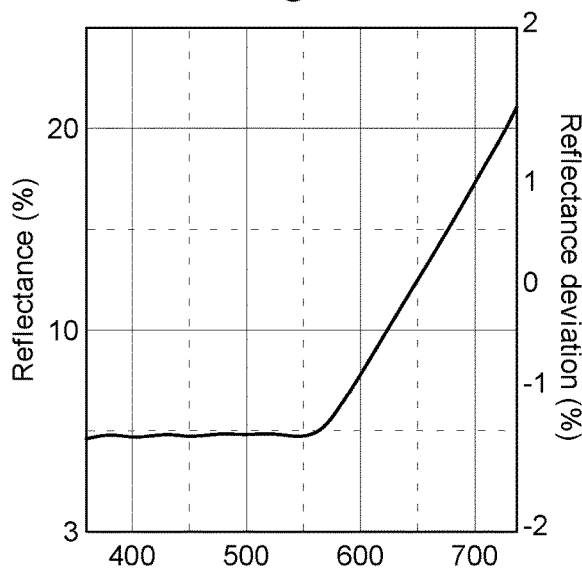
FIG. 3 shows a spectral reflectance curve measured with a spectrocolourimeter on a coating according to the invention further comprising a protective layer.

With the protective layer 124, the coating 12 has a reflection rate less than or equal to 5% in the range of wavelengths comprised between 350 nm and 550 nm, varying from 5 to 21% for wavelengths comprised between 550 nm and 750 nm. These values are represented graphically by the spectral reflectance curve of FIG. 3, resulting from measurements carried out with a spectrocolourimeter on the coating 12.

Thus, in the preferred exemplary embodiment of the invention, the coating 12 has a red colour characterised in the CIELAB chromatic space, illuminating D65, by a parameter L* comprised between 25 and 35, a parameter a* comprised between 8 and 15, and a parameter b* comprised between 0 and 7.

It should be noted that the protective layer 124 is not essential, and that in other embodiments of the invention, the coating 12 may have a red colour characterised in the CIELAB chromatic space for example by the aforementioned parameters, without said protective layer 124.

Figure 4:
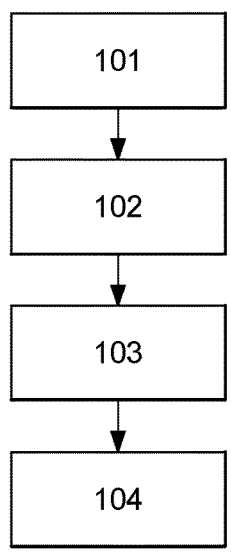
FIG. 4 shows a flowchart of a method for manufacturing an external part according to another aspect of the invention.

The present invention further relates to a method for manufacturing an external part 10 for a timepiece or a piece of jewellery, for example as described above. The successive steps of this method are represented by the flowchart of FIG. 4 and consist in generating a coating 12 on a surface of a substrate 11 in order to generate a predetermined interference colour.

More specifically, the method comprises the following successive steps:
- depositing 101 an opaque reflective layer 121 on a substrate 11, said layer being adapted to reflect wavelengths comprised between 600 nm and 780 nm,
- depositing 102 a transparent layer 122 having a refractive index comprised between 1.45 and 2.8 for a wavelength of 630 nm,
- depositing 103 an absorbent layer 123.

An example of a manufacturing method described in detail below uses a vacuum deposition technique to deposit the reflective 121, transparent 122 and absorbent 123 layers.

More particularly, in a preferred embodiment, a method of physical vapour deposition with electron gun evaporation is used.

However, it should be noted that the deposition of the layers can be carried out by other PVD methods, such as magnetron sputtering in reactive media, or by CVD method, such as the ALD method and plasma enhanced chemical vapour deposition (known by the acronym PECVD).

The deposition 101 of the reflective layer 121 is carried out, for example so that said reflective layer 121 has a thickness of 100 nm. Preferably, among the following materials that can be considered for constituting the reflective layer 121: Cu, Au, Rh or Pt, Cu is preferred.

The transparent layer 122 is then deposited on the reflective layer 121, preferably so as to have a thickness of 30 nm. Preferably, among the following materials that can be considered for constituting the transparent layer 122: SiO2, TiO2, Al2O3, HfO2, ZrO2, Ta2O5, SnO2, ITO, ZnO, MgO, Si3N4, or AlN, SiO2 is preferred.

By way of example, in order to obtain good repeatability for the deposition of the transparent layer 122, the deposition rate is selected between 0.01 nm/s and 0.1 nm/s, preferably 0.1 nm/s, and the flow of oxygen (O2) is 5 sccm. These parameters also allow very precise control of the material density and the thickness of the transparent layer 122.

The absorbent layer 123 is then deposited on the transparent layer 122, preferably so as to have a thickness for example comprised between 5 nm and 8 nm, preferably between 7.2 nm and 7.8 nm. Preferably, the absorbent layer 123 is made of chrome.

By way of example, in order to obtain good repeatability for the deposition of the absorbent layer 123, the deposition rate is selected between 0.01 nm/s and 0.05 nm/s, preferably 0.02 nm/s, and the flow of argon (Ar) is 2 sccm so as to minimise the influence of the fouling of the walls of the enclosure on the repeatability of the deposition of the absorbent layer 123.

In a preferred example of implementation of the invention, the manufacturing method also includes a final step 104 of depositing a protective layer 124. This protective layer 124 is configured to advantageously include a refractive index approximately comprised between 1.48 and 1.51 for a wavelength of 630 nm.

The invention claimed is:

1. An external part comprising a substrate including a coating composed of the following successively superimposed layers:
    an opaque or semi-opaque reflective layer, configured to have a reflectance of at least 90% for wavelengths comprised between 600 nm and 780 nm,
    a transparent or semi-transparent layer, having a refractive index comprised between 1.45 and 2.8 for a wavelength of 630 nm, and
    an absorbent layer,
    said layers giving the coating a predetermined interference colour, said coating having a red colour wherein in the CIELAB chromatic space, illuminating D65, by a parameter L* comprised between 25 and 35, a parameter a* comprised between 8 and 15, and a parameter b* comprised between 0 and 7.

2. The external part according to claim 1, wherein the reflective layer is made of a metallic material selected from: Cu, Au, Rh, and Pt.

3. The external part according to claim 1, wherein the reflective layer is made of Cu.

4. The external part according to claim 1, wherein the reflective layer has a thickness of at least 40 nm.

5. The external part according to claim 4, wherein the reflective layer has a thickness of 100 nm.

6. The external part according to claim 1, wherein the transparent layer is made of a material selected from: SiO2, TiO2, Al2O2, HfO2, ZrO2, Ta2O5, SnO2, ITO, ZnO, MgO, Si3N4, and AlN.

7. The external part according to claim 6, wherein the transparent layer is made of SiO2.

8. The external part according to claim 1, wherein the transparent layer has a thickness comprised between 10 nm and 50 nm.

9. The external part according to claim 8, wherein the transparent layer has a thickness of 30 nm.

10. The external part according to claim 1, wherein the absorbent layer is made of a material selected from: Ti, Ni or Cr.

11. The external part according to claim 10, wherein the absorbent layer is made of Cr.

12. The external part according to claim 1, wherein the absorbent layer has a thickness comprised between 5 nm and 8 nm.

13. The external part according to claim 1, wherein the coating has a reflection rate less than 10% for wavelengths comprised between 350 nm and 600 nm, and greater than or equal to 10% for wavelengths comprised between 620 nm and 780 nm.

14. The external part according to claim 1, wherein the coating comprises an acrylic and/or nitrocellulose protective layer superimposed on the absorbent layer and having a refractive index comprised between 1.48 and 1.51 for a wavelength of 630 nm.

15. The external part according to claim 14, wherein the coating has a reflection rate less than or equal to 5% for wavelengths comprised between 350 nm and 550 nm, and varies from 5 to 21% for wavelengths comprised between 550 nm and 750 nm.

16. A method for manufacturing an external part for a timepiece or a piece of jewelry, said method comprising the following successive steps of generating a coating on a surface of a substrate:

depositing an opaque reflective layer on a substrate, said layer being configured to have a reflectance greater than 90% for wavelengths comprised between 600 nm and 780 nm, depositing a transparent layer having a refractive index comprised between 1.45 and 2.8 for a wavelength of 630 nm, and depositing an absorbent layer, wherein the layers give the coating a predetermined interference colour, said coating having a red colour wherein in the CIELAB chromatic space, illuminating D65, by a parameter L* comprised between 25 and 35, a parameter a comprised between 8 and 15, and a parameter b* comprised between 0 and 7.

17. The manufacturing method according to claim 16, wherein the deposition respectively of the reflective, transparent and absorbent layers is carried out by a method of physical vapour deposition with electron gun evaporation.

18. The manufacturing method according to claim 16, wherein the step of depositing the transparent layer is carried out with a deposition rate comprised between 0.01 nm/s and 0.1 nm/s.

19. The manufacturing method according to claim 16, wherein the step of depositing the absorbent layer is carried out with a deposition rate comprised between 0.01 nm/s and 0.05 nm/s.

20. The manufacturing method according to claim 16, comprising a final step of depositing a protective layer configured to advantageously include a refractive index comprised between 1.48 and 1.51 for a wavelength equal to 630 nm.

* * * * *